US007679175B2

(12) United States Patent  (10) Patent No.: US 7,679,175 B2
Saeki  (45) Date of Patent: *Mar. 16, 2010

(54) SEMICONDUCTOR DEVICE INCLUDING SUBSTRATE AND UPPER PLATE HAVING REDUCED WARPAGE

(75) Inventor: Yoshihiro Saeki, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 873 days.

This patent is subject to a terminal disclaimer.

(21) Appl. No.: 11/386,841

(22) Filed: Mar. 23, 2006

(65) Prior Publication Data
US 2006/0214277 A1 Sep. 28, 2006

(30) Foreign Application Priority Data
Mar. 25, 2005 (JP) ............................. 2005-087644

(51) Int. Cl.
H01L 23/02 (2006.01)
(52) U.S. Cl. .................. 257/686; 257/704; 257/790; 257/E23.087; 257/E23.11
(58) Field of Classification Search ................. 257/686, 257/704, 787, 790, 796, E23.087, E23.092, 257/E23.11
See application file for complete search history.

(56) References Cited
U.S. PATENT DOCUMENTS
5,883,430 A * 3/1999 Johnson ...................... 257/706
5,886,396 A    3/1999 Carney et al.
5,990,418 A * 11/1999 Bivona et al. ................ 174/546
6,127,724 A * 10/2000 DiStefano .................... 257/675
6,627,997 B1 * 9/2003 Eguchi et al. ................ 257/777
7,372,137 B2 * 5/2008 Saeki .......................... 257/684
2003/0027373 A1   2/2003 DiStefano et al.
2004/0195572 A1  10/2004 Kato et al.
2004/0207485 A1  10/2004 Kawachi et al.
2005/0051903 A1   3/2005 Ellsberry et al.
2006/0001158 A1 * 1/2006 Matayabas et al. .......... 257/738
2007/0045791 A1   3/2007 Saeki

FOREIGN PATENT DOCUMENTS
JP   10-112515   4/1998

* cited by examiner

Primary Examiner—Matthew E Warren
(74) Attorney, Agent, or Firm—Volentine & Whitt, P.L.L.C.

(57) ABSTRACT

A semiconductor device includes a lower substrate having at least one wiring pattern formed of a plurality of wirings, a semiconductor chip positioned above the lower substrate and electrically connected to the wirings, an intermediate member which seals the semiconductor chip in columnar form and substantially, and an upper plate which substantially covers a whole upper surface of the intermediate member. A thermal expansion coefficient of the upper plate and a thermal expansion coefficient of the lower substrate are set substantially identical.

6 Claims, 6 Drawing Sheets

EXPLANATORY VIEW SHOWING SECTION OF SEMICONDUCTOR DEVICE ACCORDING TO FIRST EMBODIMENT

EXPLANATORY VIEW SHOWING SECTION OF SEMICONDUCTOR DEVICE ACCORDING TO FIRST EMBODIMENT

EXPLANATORY VIEW SHOWING TOP FACE OF SILICON SUBSTRATE EMPLOYED IN FIRST EMBODIMENT

EXPLANATORY VIEW SHOWING METHOD FOR MANUFACTURING
SEMICONDUCTOR DEVICE ACCORDING TO FIRST EMBODIMENT (P4)

(P5)

(P6)

EXPLANATORY VIEW SHOWING METHOD FOR MANUFACTURING
SEMICONDUCTOR DEVICE ACCORDING TO FIRST EMBODIMENT

EXPLANATORY VIEW SHOWING SECTION OF SEMICONDUCTOR DEVICE ACCORDING TO SECOND EMBODIMENT

EXPLANATORY VIEW SHOWING TOP FACE OF SILICON SUBSTRATE EMPLOYED IN SECOND EMBODIMENT (PA1)

(PA2)

(PA3)

(PA4)

EXPLANATORY VIEW SHOWING METHOD FOR MANUFACTURING SEMICONDUCTOR DEVICE ACCORDING TO SECOND EMBODIMENT (PA5)

(PA6)

(PA7)

EXPLANATORY VIEW SHOWING METHOD FOR MANUFACTURING SEMICONDUCTOR DEVICE ACCORDING TO SECOND EMBODIMENT

SEMICONDUCTOR DEVICE INCLUDING SUBSTRATE AND UPPER PLATE HAVING REDUCED WARPAGE

BACKGROUND OF THE INVENTION

The present invention relates to a semiconductor device wherein a semiconductor chip is electrically connected to a lower substrate and sealed, and a method for manufacturing the same.

In a conventional semiconductor device, a plurality of circuit wirings are provided in a wiring substrate or board used as a lower substrate formed of a glass epoxy resin containing glass fiber. A semiconductor chip is electrically connected to the circuit wirings and mounted thereto. The semiconductor chip mounted to the wiring board is sealed with a first encapsulating resin layer substantially equal to the wiring board in thermal expansion coefficient, followed by being heated, whereby it is temporarily cured. After the temporary curing of the first encapsulating resin layer, a second encapsulating resin layer formed of a high Tg resin matched with the wiring board in thermal expansion coefficient is applied so as to reach the thickness equivalent to the wiring board. The first and second encapsulating resin layers are thermoset and thereby manufactured. Excessive thermal expansion of the first encapsulating resin layer, which will exceed a glass transition temperature Tg upon heat treatment in a reflow process at the mounting of the semiconductor device to a mounting board or a printed circuit board, is suppressed by the second encapsulating resin layer not exceeding the glass transition temperature Tg to thereby prevent warpage of the semiconductor device.

There is also known a semiconductor device wherein after temporary curing of a first encapsulating resin layer, a high rigid member comprised of a metal or the like smaller than a range in which an encapsulating resin layer is applied, is disposed on the first encapsulating resin layer, followed by application of a second encapsulating resin layer, which in turn is thermoset to enhance the rigidity of the semiconductor device, thereby preventing warpage of the semiconductor device in a reflow process (refer to, for example, a patent document 1 (Japanese Unexamined Patent Publication No. Hei 10 (1998)-112515 (paragraph 0019 in page 4- paragraph 0031 in page 5 and paragraphs 0031-0033 in page 5, and FIGS. 1 and 3)).

However, a problem arises in that that when the technique of the patent document 1 referred to above is used for a lower substrate such as a silicon substrate whose thermal expansion coefficient is less than or equal to half the thermal expansion coefficient of the encapsulating resin layer, warpage caused by the difference between the thermal expansion coefficients of the silicon substrate and the encapsulating resin layer occurs in the semiconductor device when the silicon substrate equipped with the semiconductor chip is sealed with the encapsulating resin layer and cured by heating and cooled in its manufacturing process, i.e., the heat-cured encapsulating resin layer is more shrunk upon cooling to cause dish-shaped warpage in the semiconductor device.

Incidentally, the patent document 1 does not cause the above problem because the semiconductor chip mounted onto the wiring board formed of the glass epoxy resin is sealed with the first encapsulating resin layer approximately equal to the wiring board in thermal expansion coefficient.

Also the patent document 1 does not cause the above problem because since the high rigid member formed of the metal or the like (having a length of about half according to FIG. 3 in the patent document 1) smaller than the range in which the encapsulating resin layer is applied onto the first encapsulating resin layer, is disposed after the temporary curing of the first encapsulating resin layer, the amounts of shrinkage of the wiring board and the high rigid member reach the same degree because the length of the high rigid member less than or equal to half in thermal expansion coefficient is set to about half the length of the wiring board even though the second encapsulating resin layer is subsequently applied and thermoset.

SUMMARY OF THE INVENTION

The present invention has been made to solve the above problems. It is therefore an object of the present invention to provide means which reduces warpage of a semiconductor device at the time that a lower substrate such as a silicon substrate different from an encapsulating resin layer in thermal expansion coefficient is used.

According to one aspect of the present invention, for attaining the above object, there is provided a semiconductor device comprising a lower substrate having at least one wiring pattern formed of a plurality of wirings, a semiconductor chip positioned above the lower substrate and electrically connected to the wirings, an intermediate member which seals the semiconductor chip in columnar form and substantially, and an upper plate which substantially covers a whole upper surface of the intermediate member, wherein a thermal expansion coefficient of the upper plate is substantially identical to that of the lower substrate.

Thus, the present invention can bring about an advantageous effect in that even though the intermediate member is much shrunk as compared with the lower substrate upon its post-thermosetting cooling, the lower substrate and the upper plate disposed above and below the intermediate member are shrunk to substantially the same degree, thus making it possible to suppress warpage of the semiconductor device.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a semiconductor device according to the present invention and its manufacturing method will hereinafter be described with reference to the accompanying drawings.

First Preferred Embodiment

Figure 1:
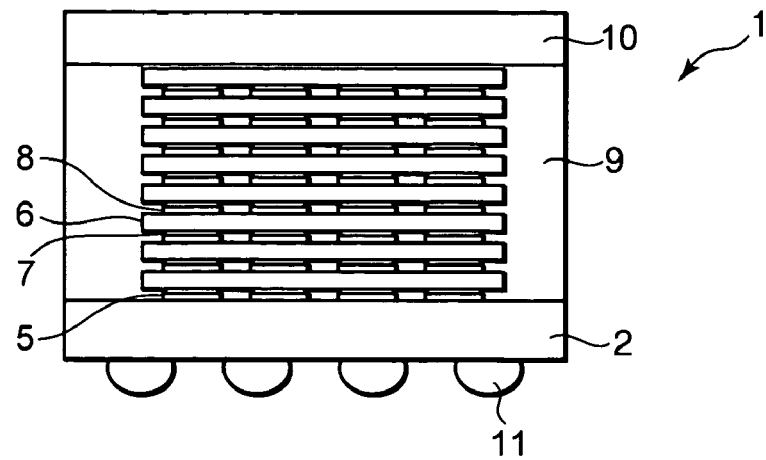
FIG. 1 is an explanatory view showing a section of a semiconductor device according to a first embodiment.
Figure 2:
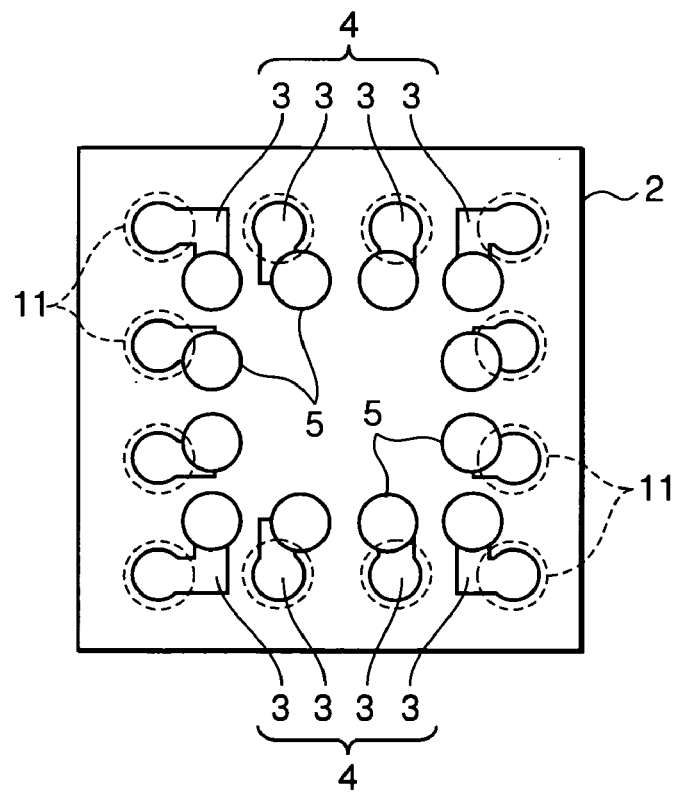
FIG. 2 is an explanatory view illustrating a top face of the semiconductor device according to the first embodiment.

FIG. 1 is an explanatory view showing a cross section of a semiconductor device according to a first embodiment, and FIG. 2 is an explanatory view illustrating a top face of a silicon substrate employed in the first embodiment, respectively.

In FIG. 1, reference numeral 1 indicates the semiconductor device.

Reference numeral 2 indicates the silicon substrate used as a lower substrate. Wiring patterns that consist of a plurality of wirings 3 are formed in the top face of the silicon substrate. A plurality of substrate ball pads 5 are formed at predetermined portions or sections of the wirings 3.

Reference numerals 6 indicate semiconductor chips. A plurality of bumps 7 are respectively disposed on the lower surfaces of the semiconductor chips. A plurality of chip ball pads 8 are respectively disposed on the upper surfaces of the semiconductor chips. The bumps 7 of each semiconductor chip 6 corresponding to an undermost layer are electrically connected to their corresponding substrate ball pads 5 formed at the wirings 3 in accordance with a flip-chip system. The plurality of semiconductor chips 6 are laminated above the undermost layer in such a manner that their mutual chip ball pads 8 and bumps 7 are electrically connected in accordance with the flip-chip system. In the present embodiment, the semiconductor chips 6 are laminated in the form of eight layers.

Reference numeral 9 indicates an encapsulating resin layer used as an intermediate member. This is a columnar member having a sectional area approximately equal to the area of the silicon substrate 2, which is formed by charging a sealing agent or sealant 9a such as an epoxy resin between the laminated semiconductor chips 6, between the semiconductor chip 6 corresponding to the undermost layer and the silicon substrate 2, between the semiconductor chip 6 corresponding to the top layer and a metal plate 10 and around the laminated semiconductor chips 6 and thermosetting the sealant 9a. The encapsulating resin layer 9 has the function of performing protection among the semiconductor chips 6 and ensuring electrical insulating properties thereof and has the function of protecting the semiconductor chips, the wiring patterns 4 and the like from outside.

In this case, the sealing of these with the encapsulating resin layer 9 may be placed in a state in which some voids are being formed. In short, it is enough if the encapsulating resin layer 9 substantially seals them so as to carry out the above functions.

The metal plate 10 used as an upper plate is a plate-like member formed of a metal material (42alloy in the present embodiment) approximately identical in thermal expansion coefficient to the silicon substrate 2, such as the 42alloy or cobale having a thickness approximately equal to that of the silicon substrate 2. The metal plate 10 is disposed so as to cover the whole upper surface of the columnar encapsulating resin layer 9 having sealed the laminated semiconductor chips 6.

The lower surface of the metal plate 10, i.e., the surface thereof on the encapsulating resin layer 9 side is given surface treatment for enhancing adhesion to the encapsulating resin layer 9, e.g., stain-like plating.

Reference numerals 11 indicate external terminals. The external terminals 11 are terminals which are disposed on the lower surface of the silicon substrate 2 and formed of a material such as a solder alloy or the like electrically connected to the predetermined wirings 3 provided on the upper surface of the silicon substrate 2. Each of the external terminals 11 has the function of electrically connecting the semiconductor device 1 and an unillustrated printed circuit board.

The semiconductor device 1 according to the present embodiment comprises the silicon substrate 2 and metal plate 10 each shaped in the form of a square whose thickness is 0.15 mm and whose one side is 12 mm, the semiconductor chips 6 laminated in the form of eight between the silicon substrate 2 and the metal plate 10 and each having one side of 10 mm, and the columnar encapsulating resin layer 9 of 0.56 mm thick which seals the semiconductor chips.

As described above, the silicon substrate 2 and the metal plate 10 are made identical in thickness and size. Further, the thermal expansion coefficients of the silicon substrate 2 and the metal plate 10 are also set approximately identical to each other using the silicon substrate 2 whose thermal expansion coefficient $\alpha a$ is about $3 \times 10^{-6}/°$ C. and the 42alloy used as the metal plate 10 whose thermal expansion coefficient $\alpha c$ is about $5 \times 10^{-6}/°$ C. Thus, the thermal expansion coefficients of the silicon substrate 2 and the metal plate 10 are reduced to less than or equal to half the thermal expansion coefficient $\alpha b$ of the encapsulating resin layer 9, which is about $11 \times 10^{-6}/°$ C.

Figure 3:
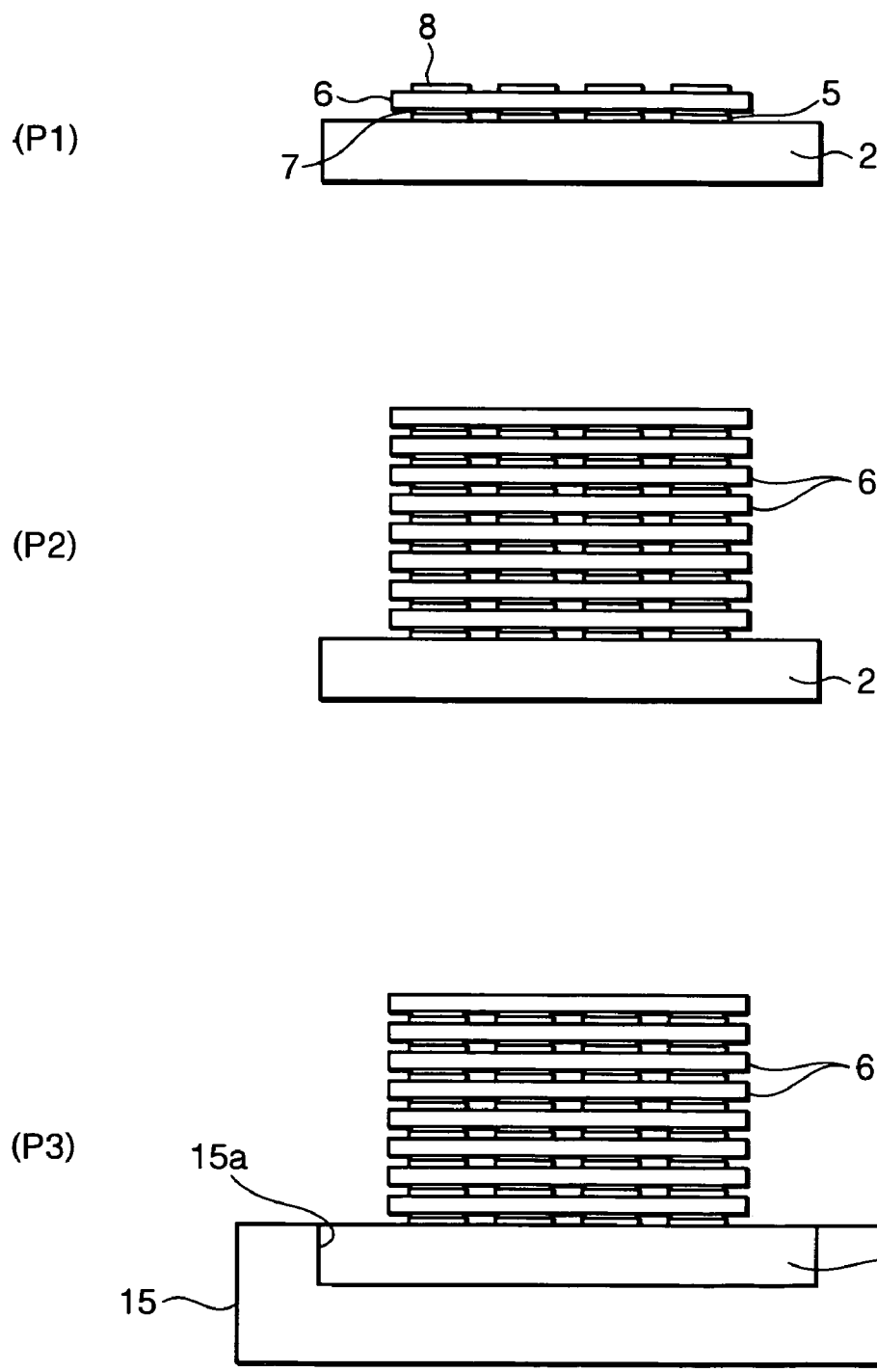
FIG. 3 is an explanatory view showing a method for manufacturing the semiconductor device according to the first embodiment.
Figure 4:
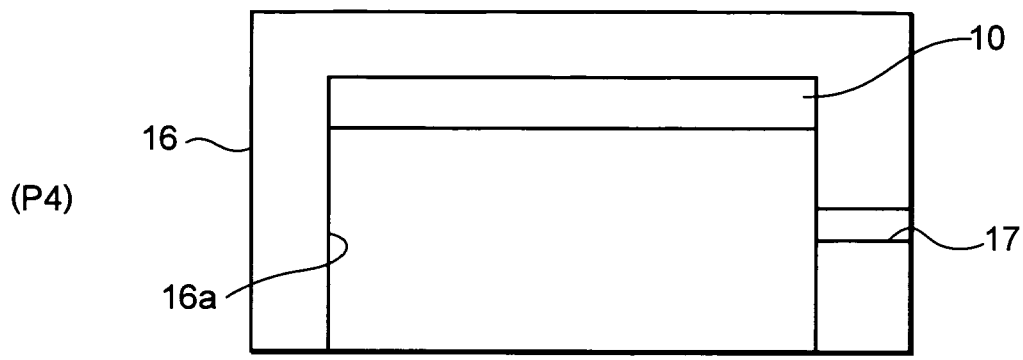
FIG. 4 is an explanatory view illustrating the method for manufacturing the semiconductor device according to the first embodiment.
Figure 4:
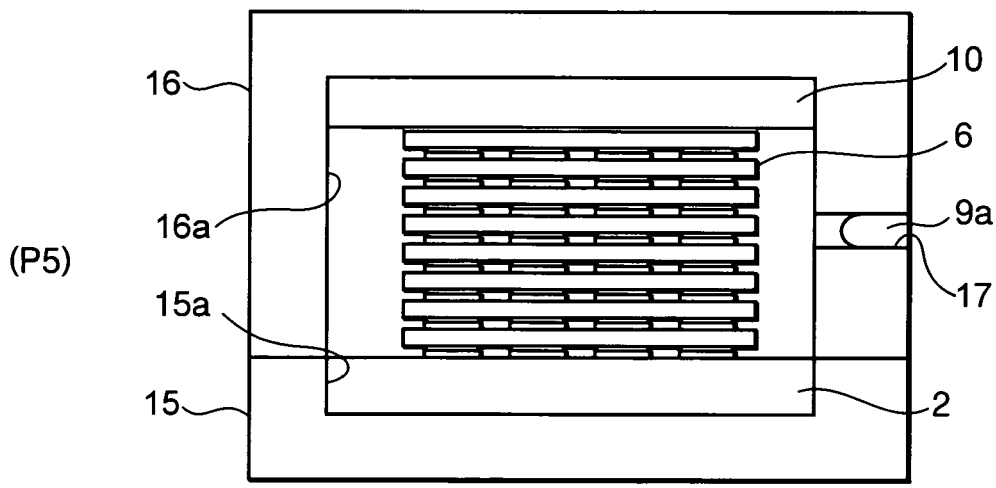
Figure 4:
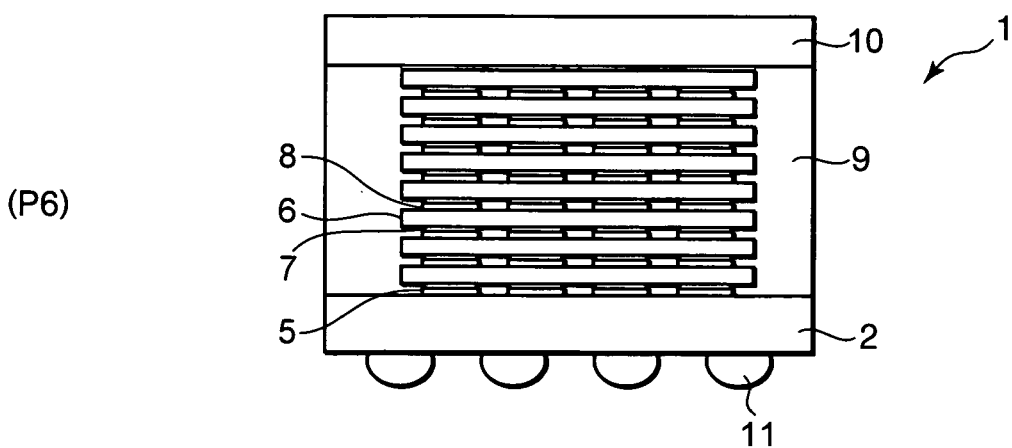

FIGS. 3 and 4 are respectively explanatory views showing a method for manufacturing the semiconductor device according to the first embodiment.

In FIGS. 3 and 4, reference numeral 15 indicates a lower die. It is a rectangular die which has an aperture having a size approximately equal to the size of a silicon substrate 2, for fitting the silicon substrate 2 therein and mounting the same therein, and which is provided with a substrate mounting hole 15a having a depth approximately identical to the thickness of the silicon substrate 2.

Reference numeral 16 indicates an upper die. It is a rectangular die which has an aperture having a size approximately identical to the size of a metal plate 10, for fitting the metal plate 10 therein and mounting it therein, and which is provided with a metal plate mounting hole 16a having a depth approximately identical to the sum of the thickness of the metal plate 10 and the thickness of an encapsulating resin layer 9 to be formed. An injection hole 17 for injecting a sealant 9a is defined in one sidewall of the upper die. The upper die is used in combination above the lower die 15.

The upper die 16 is provided with unillustrated push pins for holding the metal plate 10 on the bottom face of the metal plate mounting hole 16a.

The method for manufacturing the semiconductor device according to the present embodiment will be explained below in accordance with process steps indicated by P using FIGS. 3 and 4.

In P1 (see FIG. 3), a silicon substrate 2 in which substrate ball pads 5 are formed at predetermined sections of wiring patterns 4 formed in its upper surface by a plurality of wirings 3, is prepared. Bumps 7 placed on the lower surface of a semiconductor chip 6 corresponding to the undermost layer are disposed in alignment with their corresponding substrate ball pads 5 placed on the wirings 3.

In P2 (see FIG. 3), bumps 7 of a directly-above semiconductor chip 6 are disposed in alignment with their corresponding chip ball pads 8 on the upper surface of the semiconductor chip 6 placed on the substrate ball pads 5. Similarly, semiconductor chips 6 are placed sequentially. Thereafter, the bumps 7 are heated and melted to bond the respective semiconductor chips 6 and bond the semiconductor chip 6 corresponding to the undermost layer and the wirings 3 of the silicon substrate 2, thereby electrically connecting the semiconductor chips 6 laminated on the silicon substrate 2 in accordance with a flip-chip system and the wirings 3 of the wiring patterns 4 of the silicon substrate 2.

In P3 (see FIG. 3), the silicon substrate 2 with the laminated semiconductor chips 6 mounted thereon is fitted and mounted in its corresponding substrate mounting hole 15a of a lower die 15.

In P4 (see FIG. 4), the lower surface of another prepared metal plate 10 is fitted in the upper die 16 toward the side of an encapsulating resin layer 9, and the metal plate 10 is mounted with being held on the bottom face of a metal plate mounting hole 16a.

In P5 (see FIG. 4), the lower die 15 equipped with the silicon substrate 2 and the upper die 16 equipped with the metal plate 10 are combined together. Thereafter, a liquid sealant 9a is injected through the injection hole 17 so as to be charged between the laminated semiconductor chips 6, between the semiconductor chip 6 of the undermost layer and the silicon substrate 2 and between the semiconductor chip 6 of the top layer and the metal plate 10 and around the laminated semiconductor chips 6. Thereafter, the sealant 9a is thermoset at a temperature of about 160 to 200° C. to form a columnar encapsulating resin layer 9.

Thus, the silicon substrate 2 and the metal plate 10, and the encapsulating resin layer 9 are bonded to one another by the adhesive action of the encapsulating resin layer 9.

In P6 (see FIG. 4), the upper die 16 is opened after the thermosetting of the encapsulating resin layer 9 to take out the semiconductor device 1 from the lower die 15. After cooling of the semiconductor device 1, external terminals 11 are formed on the lower surface of the silicon substrate 2 by solder balls or the like.

The semiconductor device 1 of the present embodiment is thus manufactured wherein the plurality of semiconductor chips 6 sealed with the columnar encapsulating resin layer 9 are laminated between the silicon substrate 2 and the metal plate 10.

The semiconductor device 1 manufactured in the above-described manner is cured in a state in which the upper surface of the encapsulating resin layer 9 is all covered with the metal plate 10 upon thermosetting of the encapsulating resin layer 9. Thereafter, the semiconductor device 1 is cooled in a state in which the encapsulating resin layer 9 is interposed between the metal plate 10 and the silicon substrate 2 having thermal expansion coefficients approximately identical to each other and identical in size to each other. Therefore, even though the encapsulating resin layer 9 is shrunk with a relatively large thermal expansion coefficient in addition to its curing and shrinkage, the silicon substrate 2 and the metal plate 10 disposed above and below the encapsulating resin layer 9 are shrunk to substantially the same degree to suppress warpage of the semiconductor device 1. In addition, no warpage occurs in the semiconductor deice 1 even at thermal treatment in the process of mounting the semiconductor device 1 to a printed circuit board.

This is particularly effective where the thickness of the encapsulating resin layer 9 is thicker than that of the silicon substrate 2 and the shrinkage of the encapsulating resin layer 9 is dominant over the warpage.

Since the lower surface of the metal plate 10 is given stain-like plating to enhance adhesion between the encapsulating resin layer 9 and the metal layer 10, the metal plate 10 is not peeled off from the encapsulating resin layer 9 by virtue of shear stress produced at the interface between the encapsulating resin layer 9 and the metal plate 10 due to the difference between relatively large thermal expansion coefficients thereof.

Further, since the silicon substrate 2 (E=about 17000 kg/mm$^2$) and the metal plate 10 (E=about 15000 kg/mm$^2$ at 42alloy) approximately identical to each other in vertical elastic modulus E are made identical to each other in thickness and their flexural rigidities are made substantially identical to each other, the flexural rigidity of the metal plate 10 is not made excessively larger than the silicon substrate 2, and no warpage occurs in the silicon substrate 2 by local shrinkage of the encapsulating resin layer 9 on the silicon substrate 2 side.

Thus, when another one, for example, one high in vertical elastic modulus E is used as the material for the metal plate 10, the thickness of the metal plate 10 is made slightly thin and the flexural rigidities may be set substantially identical.

Incidentally, although the present embodiment has explained the surface treatment given to the lower surface of the metal plate 10 as the stain-line plating, the surface treatment given to the lower surface is not limited to it but may be surface treatment based on a chemical method such as etching or a mechanical method such as shot peening. In brief, any one may be selected if ones in which fine projections and depressions are formed in the lower surface of the metal plate 10 to enhance adhesion to the encapsulating resin layer 9, are used.

Although the metal plate 10 has been explained as being identical in size to the silicon substrate 2, the junction areas of the metal plate 10 and the silicon substrate 2, and the encapsulating resin layer 9 may be set approximately identical, and there is no need to cause the sizes of the metal plate 10 and the silicon substrate 2 to coincide with each other.

In the present embodiment as described above, the semiconductor chips mounted to the silicon substrate are sealed with the columnar encapsulating resin layer large in thermal expansion coefficient, and the thermal expansion coefficient of the metal plate that covers the whole upper surface of the encapsulating resin layer is set approximately identical to that of the silicon substrate. Thus, even though the encapsulating resin layer is much shrunk as compared with the silicon substrate upon its post-thermosetting cooling, the silicon substrate and the metal plate disposed above and below encapsulating resin layer are shrunk to substantially the same degree, thus making it possible to suppress warpage of the semiconductor device.

With the setting of the silicon substrate and the metal plate to substantially the same thickness, they can be made approximately identical to each other in flexural rigidity, thereby making it possible to suppress warpage of the semiconductor device due to the difference in flexural rigidity.

Further, since the upper die and the lower die are combined together, and the semiconductor chips laminated over the silicon substrate and the metal plate can be sealed simultaneously, the time required to manufacture the semiconductor device can be shortened.

Furthermore, since the semiconductor chips are electrically connected to one another in accordance with the flip-chip system, a wire bonding process step is omitted to enable the simplification of a manufacturing process, and space for connections of wires becomes unnecessary, thus making it possible to miniaturize the semiconductor device.

Second Preferred Embodiment

Figure 5:
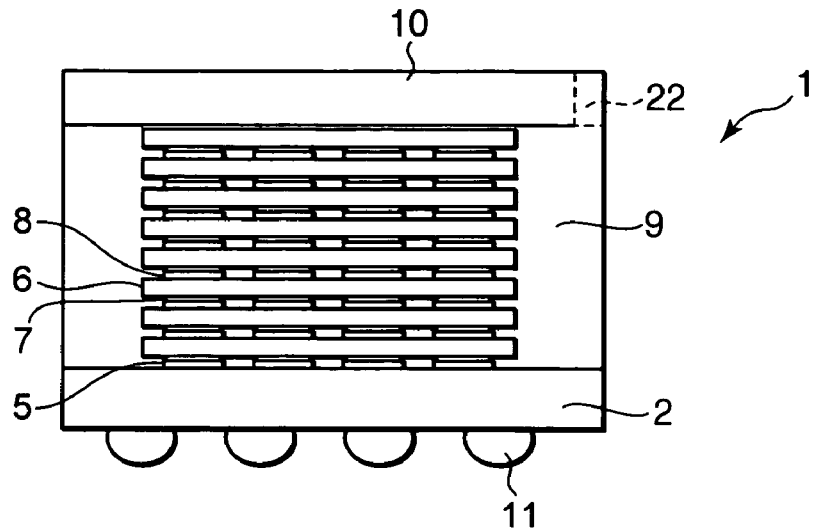
FIG. 5 is an explanatory view showing a section of a semiconductor device according to a second embodiment.
Figure 6:
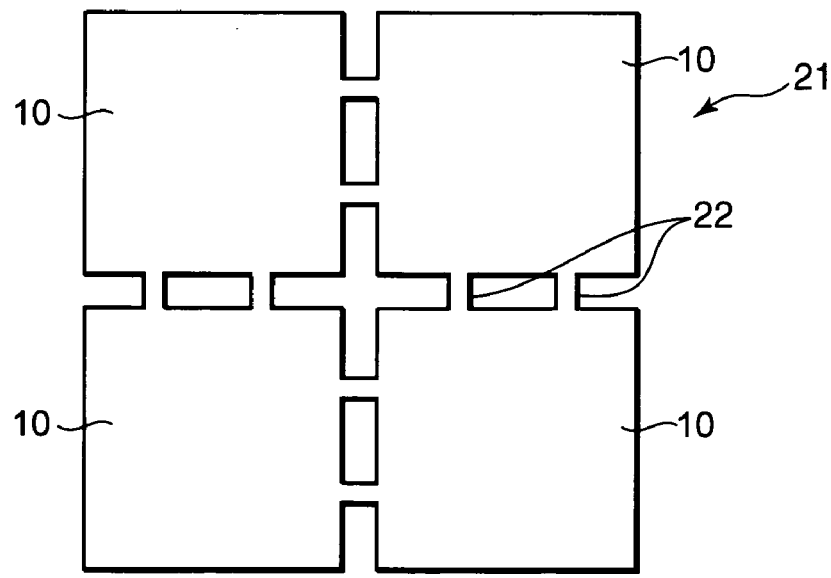
FIG. 6 is an explanatory view illustrating a top face of a metal plate body employed in the second embodiment.

FIG. 5 is an explanatory view showing a cross section of a semiconductor device according to a second embodiment, and FIG. 6 is an explanatory view showing a top face of a metal plate body employed in the second embodiment, respectively.

Incidentally, portions similar to the first embodiment are given the same reference numerals and their explanations are omitted.

In FIGS. 5 and 6, reference numeral 21 indicates a metal plate body used as an upper plate. The metal plate body is constituted by connecting a plurality of metal plates 10 similar to the first embodiment by means of slender or thin connecting portions 22 formed of the same material as the metal plates 10. The metal plate body is formed by punching out a plate member of substantially the same size as a silicon substrate 2 of the present embodiment, which is formed of the material of each metal plate 10, by a press machine.

The metal plate body 21 of the present embodiment is constituted in such a manner that four metal plates 10 are disposed in matrix form and sides opposite to face to face with one another are respectively connected by two connecting portions 22. A lower surface thereof is given surface treatment similar to the first embodiment.

Figure 7:
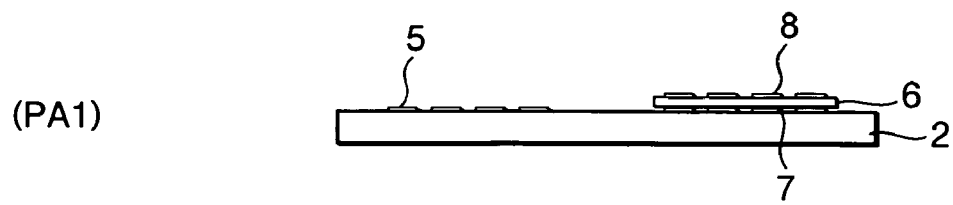
FIG. 7 is an explanatory view depicting a method for manufacturing the semiconductor device according to the second embodiment.
Figure 7:
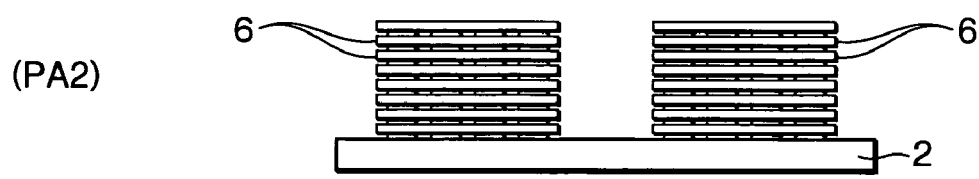
Figure 7:
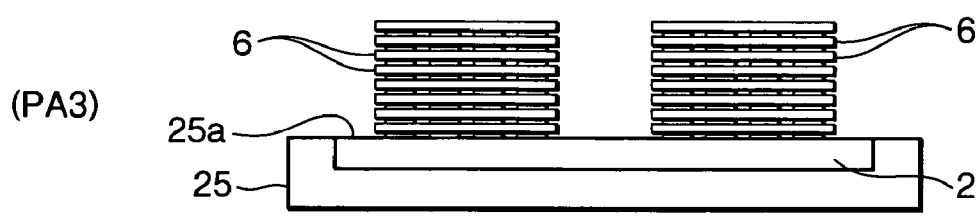
Figure 7:
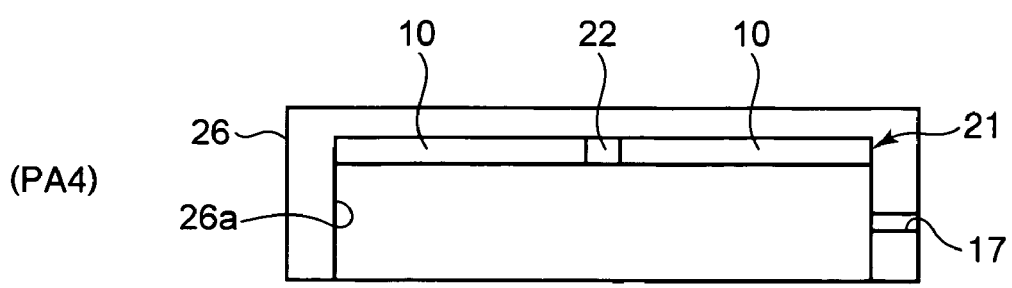
Figure 8:
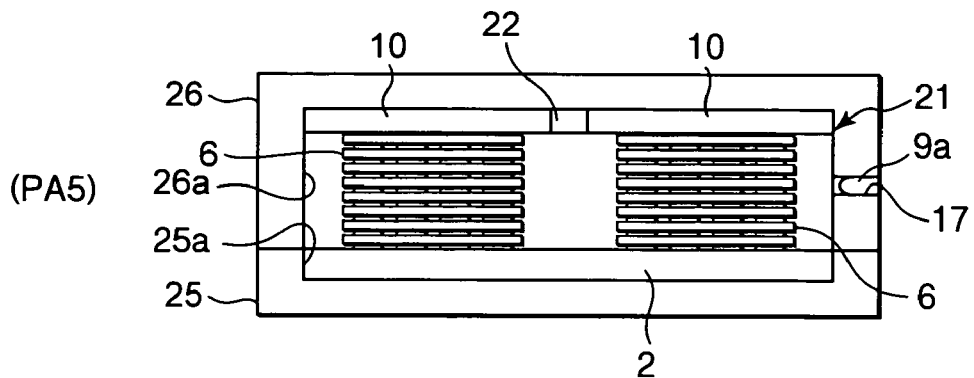
FIG. 8 is an explanatory view showing the method for manufacturing the semiconductor device according to the second embodiment.
Figure 8:
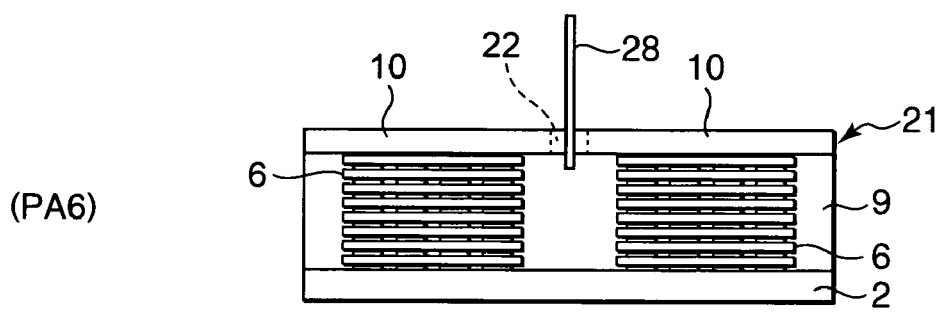
Figure 8:
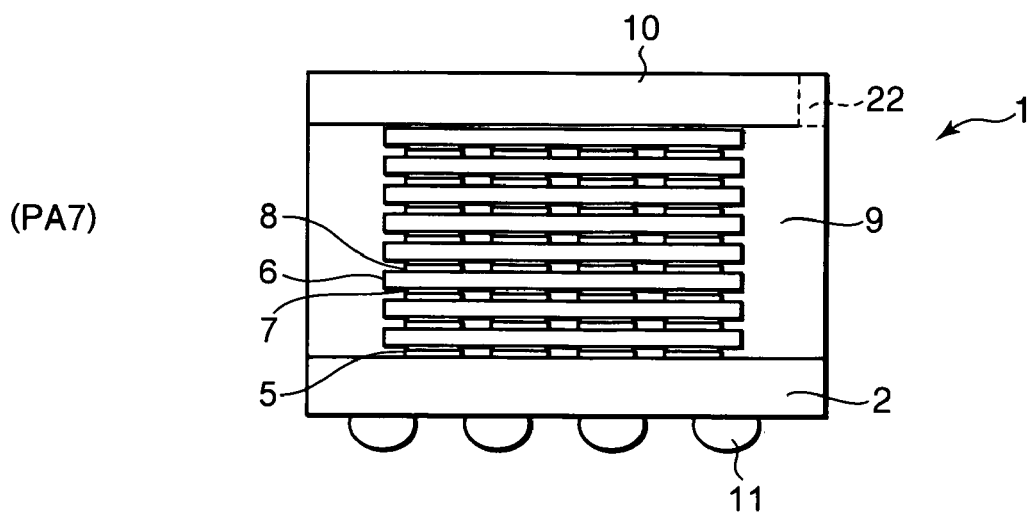

FIGS. 7 and 8 are respectively explanatory views showing a method for manufacturing the semiconductor device of the second embodiment.

In FIGS. 7 and 8, reference numeral 25 indicates a lower die, which is a die similar to the lower die 15 of the first embodiment and different therefrom in that an aperture or opening of a substrate mounting hole 25a becomes a size approximately equal to the size of the silicon substrate 2 of the present embodiment.

Reference numeral 26 indicates an upper die, which is a die similar to the upper die 16 of the first embodiment and different therefrom in that a metal plate body mounting hole 26a having an aperture of substantially the same size as the size of a metal plate body 21, for fitting the metal plate body 21 therein and mounting the same is provided.

Reference numeral 28 indicates a dicing blade, which is a thin grinding stone formed of abrasive grain of diamond.

The silicon substrate 2 of the present embodiment is a silicon substrate in which four wiring patterns 4 are disposed in matrix form in association with the metal plates 10 of the metal plate body 21.

The method for manufacturing the semiconductor device of the present embodiment will hereinafter be explained in accordance with process steps indicated by P using FIGS. 7 and 8.

In PA1 (see FIG. 7), a silicon substrate 2 is prepared in which a plurality of wiring patterns 4 are formed in its upper surface and substrate ball pads 5 are formed at predetermined sections of the respective wiring patterns 4. In a manner similar to the process step P1 of the first embodiment, a semiconductor chip 6 corresponding to an undermost layer is placed on a predetermined section of one wiring pattern 4 of the silicon substrate 2. Similarly, semiconductor chips 6 each corresponding to an undermost layer are placed on their corresponding predetermined sections of other wiring patterns 4.

In PA2 (see FIG. 7), semiconductor chips 6 are placed over the respective semiconductor chips 6 of the undermost layers in order in a manner similar to the process step P2 of the first embodiment. Thereafter, bumps 7 are heated and melted to laminate the semiconductor chips 6 over the respective wiring patterns 4. Thus, the semiconductor chips 6 laminated by their flip-chip systems are electrically connected to their corresponding wirings 3 of the wiring patterns 4.

In PA3 (see FIG. 7), the silicon substrate 2 is fitted and mounted in its corresponding substrate mounting hole 25a of the lower die 25 in a manner similar to the process step P3 of the first embodiment.

In PA4 (see FIG. 7), another prepared metal plate body 21 is fitted in its corresponding upper die 26 and held and mounted on the bottom face of a metal plate body mounting hole 26a in a manner similar to the process step P4 of the first embodiment.

In PA5 (see FIG. 8), the lower die 25 and the upper die 26 are combined together in a manner similar to the process step P5 of the first embodiment. Thereafter, a sealant 9a is injected and charged between the laminated semiconductor chips 6, between each semiconductor chip 6 of the undermost layer and the silicon substrate 2 and between each semiconductor chip 6 of the top layer and the metal plate body 21, and around the laminated semiconductor chips 6 and into sections excluding the connecting portions 22 between the adjacent metal plates 10 of the metal plate body 21. Thereafter, the sealant 9a is thermoset to form an encapsulating resin layer 9.

Thus, the silicon substrate 2 and the metal plate body 21, and the encapsulating resin layer 9 are bonded to one another by the adhesive action of the encapsulating resin layer 9.

In PA6 (see FIG. 8), the upper die 26 is opened after the curing of the encapsulating resin layer 9 to take out from the lower die 25, a plurality of semiconductor devices 1 in which the semiconductor chips 6 laminated between the silicon substrate 2 and the metal plate body 21 are sealed with the encapsulating resin layer 9. After cooling of the semiconductor devices 1, the metal plate body 21, the encapsulating resin layer 9 and the silicon substrate 2 are cut and fractionized by the dicing blade in such a manner that substantially the centers of the connecting portions 22 of the metal plate body 21 are cut by the dicing blade, i.e., one wiring pattern 4 of the silicon substrate 2 is included.

In PA7 (see FIG. 8), external terminals 11 are formed on the lower surfaces of the subsequently-fractionized silicon substrates 2 by means of solder balls or the like.

In this case, the silicon substrate 2 taken out from the die in the process step PA6 may be fractionized after the formation of the external terminals 11 on the lower surface thereof.

Thus, the semiconductor device 1 of the present embodiment is manufactured in which the plurality of semiconductor chips 6 sealed with the encapsulating resin layer 9 are laminated between the silicon substrate 2 and the metal plates 10.

The semiconductor device 1 manufactured in the above-described manner is cured in a state in which the upper surface of the encapsulating resin layer 9 is all covered with the metal plate body 21 upon thermosetting of the encapsulating resin layer 9. Thereafter, the semiconductor device 1 is cooled in a state in which the encapsulating resin layer 9 is interposed between the metal plate body 21 and the silicon substrate 2 having thermal expansion coefficients approximately identical to each other and approximately identical in size to each other. Therefore, even though the encapsulating resin layer 9 is shrunk with a relatively large thermal expansion coefficient in addition to its curing and shrinkage, the silicon substrate 2 and the metal plate body 21 disposed above and below the encapsulating resin layer 9 are shrunk to substantially the same degree to suppress warpage of the semiconductor device 1.

The plurality of metal plates 10 are connected to one another by the connecting portions 22 to form the plurality of semiconductor devices 1 at a time, followed by being divided into individuals, whereby the corresponding semiconductor device 1 is manufactured. Therefore, the time required to manufacture the semiconductor device 1 can be shortened and the metal portions to be cut by the dicing blade can be limited to the connecting portions 22, thereby making it possible to prevent deformation due to burrs and sags produced by the cutting of the metal portions.

Further, in the semiconductor device 1 of the present embodiment, the upper surface of the encapsulating resin layer 9 is covered with the metal plate 10 placed in a state in which part of each connecting portion 22 remains. However, the sum of the lengths of the metal plates 10 and the lengths of the connecting portions 22 left behind by cutting is set approximately equal to the length of the silicon substrate 2, and the whole upper surface of the encapsulating resin layer 9 is substantially covered with the metal plates 10, whereby each of the metal plates 10 acts in a manner similar to the metal plate 10 of the first embodiment, which covers the whole upper surface of the encapsulating resin layer 9. Therefore, no warpage occurs in the semiconductor device 1 even at heat treatment in the process of packaging the semiconductor device 1 onto a printed circuit board.

Further, since the rigidities of the upper portions of the plurality of semiconductor devices 1 placed in a state in which the metal plate body 21 is bonded to the upper surface of the encapsulating resin layer 9 and taken out from the die, are enhanced, the lower surface of the silicon substrate 2 which holds the metal plate body 21 side and is placed on its opposite side, can easily be processed by grinding or the like. This is similar even after division of the semiconductor devices into individuals.

Incidentally, although the present embodiment has explained the case in which the metal plate body 21 is constituted by disposing the metal plates 10 in matrix form and connecting the metal plates 10 by the connecting portions 22, the layout of the metal plates 10 is not limited to the above. A strip-like metal plate body 21 may be used in which metal plates 10 are linearly connected by their corresponding connecting portions 22. Alternatively, a plate in which a plurality of metal plates 10 are connected with no connecting portions 22, i.e., a metal plate body 21 comprised of one plate having a size equivalent to the number of semiconductor devices 1 to be formed may be used.

Although a description has been made of the case in which the connecting portions 22 are provided two, the number of connecting portions may be one or three or more.

Further, although a description has been made of the case in which the metal plate body 21 is constituted by connecting the four metal plates 10 by means of the connecting portions 22, the number of the metal plates 10 constituting the metal plate body 21 may be any number if the number thereof is taken in plural form. As a metal plate body 21 having a size similar to a semiconductor wafer, one in which a number of metal plates 10 are connected by their corresponding connecting portions 22 and disposed in matrix form, may be used.

Furthermore, although the present embodiment has explained the case in which the semiconductor devices 1 are manufactured by fractionization by cutting using the dicing blade, semiconductor devices may be manufactured by fractionization by laser-based cutting, cutting based on a press machine or the like.

In the present embodiment as described above, in addition to advantageous effects similar to the first embodiment, the silicon substrate having the plurality of wiring patterns and the metal plate body in which the plurality of metal plates are connected by their corresponding connecting portions, are used. The upper die and the lower die are combined together and sealed at a time, followed by fractionization, whereby the semiconductor devices are manufactured. Therefore, the time required to manufacture the semiconductor device can be shortened, and the metal portions to be cut by the dicing blade can be limited to the connecting portions, thereby making it possible to prevent deformation produced due to the burrs and sags by cutting of the metal portions.

Incidentally, although each of the embodiments has explained, as an example, the semiconductor device in which the plurality of semiconductor chips are laminated in the form of eight layers, the laminated semiconductor chips may be large or small in number. If one layer is taken, then advantageous effects similar to the above can be obtained.

Although each of the embodiments has explained the case in which the bumps on the lower surface of the semiconductor chip are bonded to their corresponding chip ball pads on the upper surface of the semiconductor chip placed in the layer below the semiconductor chip, the semiconductor chip is turned upside down and the bumps on the upper surface of the semiconductor chip may be bonded to their corresponding chip ball pads on the lower surface of the semiconductor chip placed in the layer above the semiconductor chip. Alternatively, bumps may be formed on both surfaces of the semiconductor chip and bonded to one another. When the semiconductor chip is reversed in this case, bumps are formed instead of the substrate ball pads on the wirings of each wiring pattern.

Further, although each of the embodiments has explained the case in which one semiconductor device is provided with one laminated semiconductor chip, the laminated semiconductor chips may be bonded to plural spots of each wiring pattern of the silicon substrate so as to configure one semiconductor device.

Furthermore, although each of the embodiments has described the case in which the upper die is held by the push pins, the top plate of the upper die is provided with a suction hole and the upper die may be held under suction of negative vacuum. Alternatively, when the metal plate or metal plate body is of a magnetic material, the upper die may be adsorbed by a magnetic force.

Since the 42alloy is susceptible to magnetization in this case, the magnetized 42alloy may be attached onto the metal plate mounting hole or the bottom face thereof so as to be held thereat.

Still further, although each of the embodiments has explained the case in which the upper die is combined with the lower die above the lower die and the sealant is injected through the injection hole to form the encapsulating resin layer, the upper die equipped with the metal plate or the metal plate body is placed below with no injection hole, and the sealant is charged into the metal plate mounting hole or the metal plate body mounting hole. The silicon substrate equipped with the laminated semiconductor chips is held by the lower die and the sealant is immersed from the semiconductor chip side to combine the upper die and the lower die. Thereafter, the sealant may be thermoset so as to form the encapsulating resin layer.

Incidentally, although the lower substrate and the upper plate to which the present invention is applied, have been explained as being the silicon substrate or 42alloy lower in thermal expansion coefficient than the encapsulating resin layer, the material for each of the lower substrate and the upper plate is not limited to the above. A lower substrate and an upper plate formed of a ceramic material, a metal material, sapphire or the like may be used. That is, even though any lower substrate is used if ones relatively large in the difference in thermal expansion coefficients as compared with the encapsulating resin layer are taken, the warpage of each semiconductor device in the manufacturing process can be suppressed if an upper plate having a thermal expansion coefficient substantially equal to the lower substrate and having a size approximately identical thereto is used under application of the present invention. Thus, even when the present invention is applied where the lower substrate higher in thermal expansion coefficient than the encapsulating resin layer is used, a similar advantageous effect can be obtained.

Although the material for the upper plate having substantially the same thermal expansion coefficient as that of the lower substrate has been explained above as the material different from the lower substrate, the material of the upper plate may be the same material as the lower substrate. In doing so, the upper plate and the lower substrate can be made identical in thermal expansion coefficient and the warpage of the semiconductor device can be further suppressed. Further, the time required to perform confirmation work on the warpage of the semiconductor device can be shortened.

While the preferred forms of the present invention have been described, it is to be understood that modifications will be apparent to those skilled in the art without departing from the spirit of the invention.

In the present application, no method claim is claimed. However, the following claims may be claimed in a separate application.

A method for manufacturing a semiconductor device, comprising the steps of:

mounting a semiconductor chip above a lower substrate having at least one wiring pattern formed of a plurality of wirings and electrically connecting the semiconductor chip to the wirings;

mounting the lower substrate onto a first die;

mounting an upper plate onto a second die;

combining the first die and the second die; and injecting an intermediate member in the inside of the combined first and second dies.

In the method, wherein the first die is a lower die and the second die is an upper die.

In the method, wherein a thermal expansion coefficient of the upper plate is set substantially identical to that of the lower substrate.

In the method, wherein materials for the lower substrate and the upper plate are set identical to each other.

In the method, wherein the thicknesses of the lower substrate and the upper plate are set substantially identical to each other.

In the method, wherein the semiconductor chip is plural.

In the method, wherein the semiconductor chip is electrically connected to the wirings in accordance with a flip-chip system.

In the method, wherein the lower substrate makes use of silicon, the intermediate member makes use of a resin, and the upper plate makes use of a 42alloy or cobale.

As another example, a method for manufacturing a semiconductor device, comprising:

mounting a semiconductor chip above a lower substrate having a plurality of wiring patterns formed of a plurality of wirings and electrically connecting the semiconductor chip to the wirings of the wiring patterns;

mounting the lower substrate onto a first die;

mounting an upper plate onto a second die;

combining the first die and the second die;

injecting an intermediate member into the inside of the combined first and second dies; and cutting the upper plate, the intermediate member and the lower substrate so as to include the one wiring pattern to fractionize the same.

In the method, wherein the first die is a lower die and the second die is an upper die.

In the method, wherein a thermal expansion coefficient of the upper plate is set substantially identical to that of the lower substrate.

In the method, wherein materials for the lower substrate and the upper plate are set identical to each other.

In the method, wherein the thicknesses of the lower substrate and the upper plate are set substantially identical to each other.

In the method, wherein the semiconductor chip is plural.

In the method, wherein the semiconductor chip is electrically connected to the wirings in accordance with a flip-chip system.

In the method, wherein the lower substrate makes use of silicon, the intermediate member makes use of a resin, and the upper plate makes use of a 42alloy or cobale.

What is claimed is:

1. A semiconductor device comprising:

a silicon substrate having at least one wiring pattern formed of a plurality of wirings;

a semiconductor chip positioned above the silicon substrate and electrically connected to the wirings;

an intermediate member which seals the semiconductor chip; and an upper plate which substantially covers a whole upper surface of the intermediate member, wherein a thermal expansion coefficient of the upper plate is substantially identical to a thermal expansion coefficient of the silicon substrate, and wherein the thermal expansion coefficient of the silicon substrate and the thermal expansion coefficient of the upper plate are less than or equal to half a thermal expansion coefficient of the intermediate member.

2. The semiconductor device according to claim 1, wherein thicknesses of the silicon substrate and the upper plate are substantially identical to each other.

3. The semiconductor device according to claim 2, further comprising a plurality of semiconductor chips positioned above the silicon substrate.

4. The semiconductor device according to claim 3, wherein the semiconductor chips are electrically connected to the wirings in accordance with a flip-chip system.

5. The semiconductor device according to claim 1, further comprising a plurality of semiconductor chips positioned above the silicon substrate.

6. The semiconductor device according to claim 5, wherein the semiconductor chips are electrically connected to the wirings in accordance with a flip-chip system.

* * * * *